US007045866B2

(12) United States Patent
Taniguchi et al.

(10) Patent No.: US 7,045,866 B2
(45) Date of Patent: May 16, 2006

(54) NONVOLATILE SEMICONDUCTOR MEMORY DEVICE

(75) Inventors: Toshimitsu Taniguchi, Ota (JP); Toshiyuki Ohkoda, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/981,753

(22) Filed: Nov. 5, 2004

(65) Prior Publication Data

US 2005/0151205 A1    Jul. 14, 2005

(30) Foreign Application Priority Data

Nov. 5, 2003    (JP) ............................. 2003-375382

(51) Int. Cl.
*H01L 29/76* (2006.01)

(52) U.S. Cl. ........................................ 257/390; 257/391

(58) Field of Classification Search ................ 257/390, 257/391, 208, 209, 202, 204, 205, 210, 211
See application file for complete search history.

(56) References Cited

U.S. PATENT DOCUMENTS 5,917,224 A * 6/1999 Zangara ....................... 257/390

FOREIGN PATENT DOCUMENTS

JP    2003-114247    4/2003

* cited by examiner

*Primary Examiner*—Minhloan Tran
*Assistant Examiner*—Benjamin Tzu-Hung Liu
(74) *Attorney, Agent, or Firm*—Morrison & Foerster LLP (57) ABSTRACT

This invention offers a ROM in which a user can program his digital data. In a memory cell array of the ROM, in which a plurality of interlayer insulation layers and a plurality of metal layers (including a bit line which makes an uppermost layer) are alternately stacked over each memory transistor, an insulation layer is formed on a tungsten plug in a first contact hole provided in a first interlayer insulation layer. The ROM is programmed by writing digital data "1" or "0" in each of the memory transistors according to whether a dielectric breakdown of the insulation layer is caused by a predetermined programming voltage (high voltage) applied from the bit line.

8 Claims, 5 Drawing Sheets

NONVOLATILE SEMICONDUCTOR MEMORY DEVICE

CROSS-REFERENCE OF THE INVENTION

This invention is based on Japanese Patent Application No. 2003-375382, the content of which is incorporated herein by reference in its entirety.

BACKGROUND OF THE INVENTION

1. Field of the Invention

This invention relates to a nonvolatile semiconductor memory, specifically to an electrically programmable ROM (Read-Only Memory).

2. Description of the Related Art

In recent years, electronic tags have become widespread use for non-contact object recognition in applications such as material flow control with RF-ID tags, controlled access system and checkout control system. The electronic tags are attached to a large number of objects of recognition, and store digital information on the objects in embedded memories. In general, the digital information mentioned above is programmed and read in a non-contact manner with a reader/writer of a user.

The memory to store the digital information is a mask ROM, or the like. The digital data has been written into the mask ROM and fixed when the mask ROM is completed. Thus, the user of the electronic tag can not program his digital data into the mask ROM, after the electronic tag incorporating the mask ROM is shipped to a market as a product.

Therefore, EPROMs (erasable programmable ROMs) and EEPROMs (electrically erasable programmable ROMs), into which the user can program his data electrically, are often used as the memories incorporated in the electronic tags.

However, a production cost of the electronic tag incorporating the EPROM or the EEPROM of a conventional art is increased because of more complicated manufacturing process due to structures of the EPROM and the EEPROM. There arises a problem that the price of the memory and the price of the electronic tag incorporating the memory are increased.

Furthermore, since the electronic tag is used in various environment such as under ultraviolet light from the sun or at high temperature, it is necessary to apply additional processing in order to adjust the electronic tag to the environment. More specifically, for example, the electronic tag incorporating the EPROM needs a package which shields the EPROM from sunlight including ultraviolet light, since the stored data in the EPROM is erased by ultraviolet light. For that purpose, an additional packaging process is required in manufacturing the electronic tag. In general, the cost of packaging is expensive relative to the manufacturing cost of the semiconductor device itself, thus the cost of packaging significantly increases the manufacturing cost of the electronic tag.

On the other hand, although the user can not program his digital data into the mask ROM of the conventional art, the mask ROM is cheaper than the EPROM or EEPROM, and has high resistance to the environment (hereafter referred to as environmental immunity) such as ultraviolet light and high temperature.

This invention offers a ROM into which digital data can be programmed by the user and suitable as the memory incorporated in the electronic tag described above, or the like.

SUMMARY OF THE INVENTION

This invention provides a ROM including a memory transistor, a word line connected to a gate of the memory transistor, a plurality of interlayer insulation layers and a plurality of metal layers alternately stacked over the memory transistor, a bit line made of an uppermost metal layer, a plurality of contact holes provided in each of the plurality of interlayer insulation layers, a metal plug buried in each of the plurality of contact holes and insulation layers to insulate the metal plugs from the metal layers. Data is programmed into the memory transistor by a dielectric breakdown of the insulation layer caused by applying a high voltage from the bit line.

Also, this invention offers a ROM including a memory transistor, a word line connected to a gate of the memory transistor, a plurality of interlayer insulation layers and a plurality of metal layers alternately stacked over a region adjacent the memory transistor, a bit line made of an uppermost metal layer, a plurality of contact holes provided in each of the plurality of interlayer insulation layers, a metal plug buried in each of the plurality of contact holes and connectable to the metal layer, a first polysilicon layer electrically connected with a drain of the memory transistor, an insulation layer formed to cover the first polysilicon layer and a second polysilicon layer isolated from the first polysilicon layer and electrically connected with the metal plug buried in a contact hole in a lowermost interlayer insulation layer. Data is programmed into the memory transistor by a dielectric breakdown of the insulation layer caused by applying a high voltage from the bit line.

DETAILED DESCRIPTION OF THE INVENTION

Next, embodiments of this invention will be explained referring to the figures hereinafter. A ROM according to each embodiment is incorporated in the electronic tag which is programmed and read in the non-contact manner, or the like. Also, the ROM may be incorporated in other equipment or system, or may be used as a discrete device.

Figure 1:
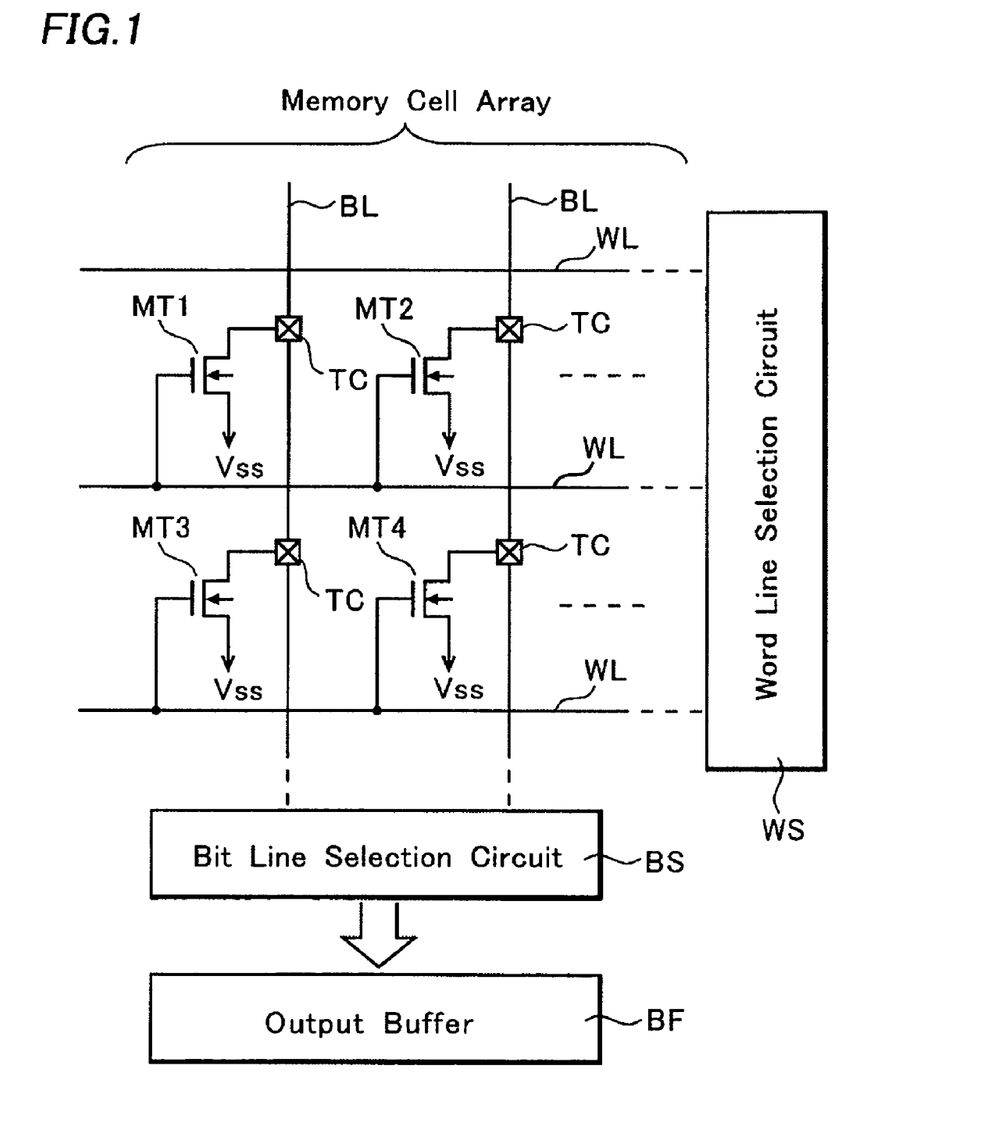
FIG. 1 is a circuit diagram of a ROM according to a first embodiment of this invention.
Figure 2:
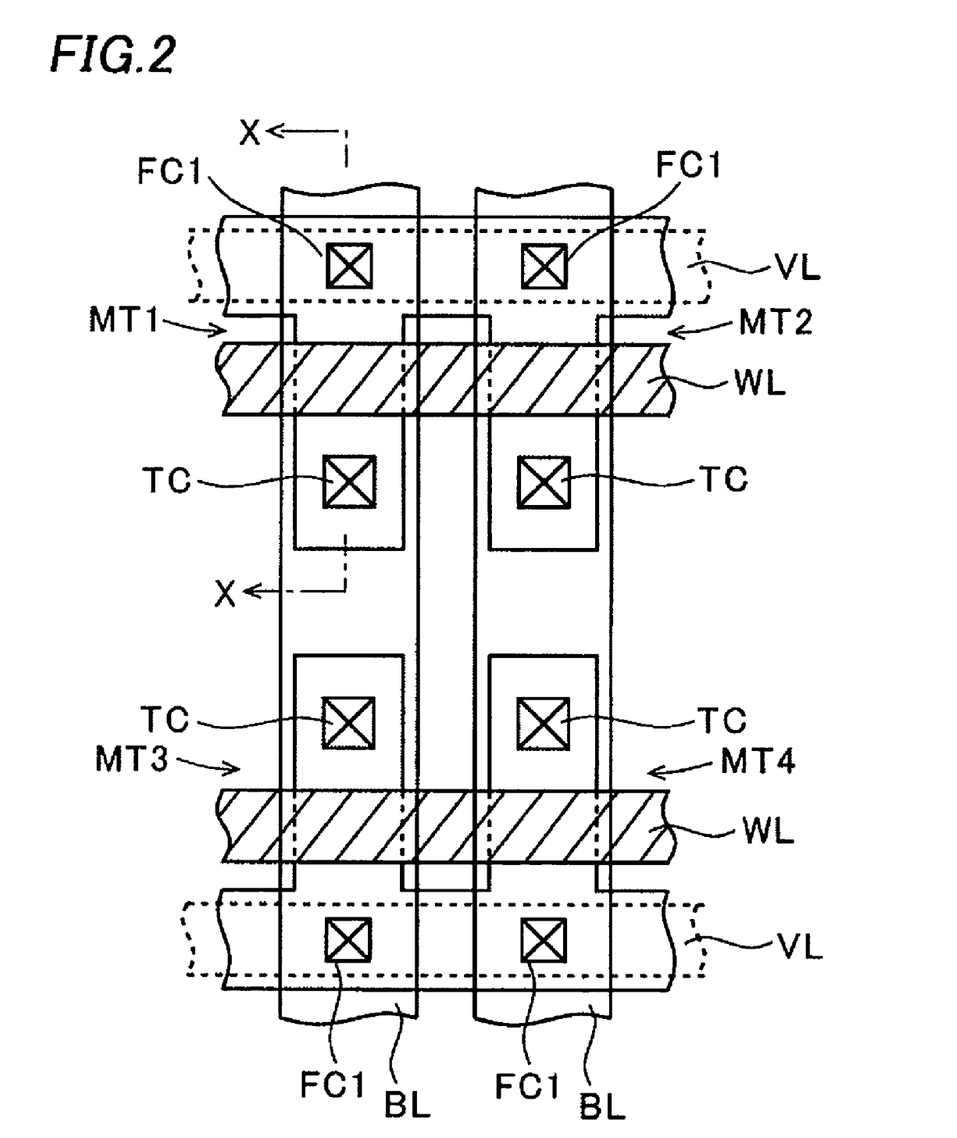
FIG. 2 is a layout of a memory cell array in the ROM shown in FIG. 1.

First, a ROM according to a first embodiment of this invention will be described hereafter. FIG. 1 is a circuit diagram of the ROM according to the first embodiment, and FIG. 2 is a layout of a memory cell array in the ROM shown in FIG. 1.

The ROM of the first embodiment has the memory cell array in which a large number of memory transistors are disposed in a matrix form, as shown in FIG. 1. The memory cell array is structured as described below. Note that FIG. 1 and FIG. 2 show only four memory transistors MT1, MT2, MT3 and MT4 out of the large number of memory transistors disposed in the memory cell array. All of the memory transistors MT1, MT2, MT3, MT4 and other memory transistors not shown in the figures are N-channel MOS transistors. However, they may be P-channel MOS transistors.

A plurality of word lines WL made of polysilicon or polycide, or the like, is disposed in a row direction of the memory cell array. The word lines WL are connected to a word line selection circuit WS. The word line selection circuit WS selects a word line WL out of the plurality of word lines WL according to a word line selection signal.

Also, a plurality of bit lines BL is disposed in a column direction of the memory cell array. The bit lines BL are connected to a bit line selection circuit BS. The bit line selection circuit BS selects a bit line BL out of the plurality of bit lines BL according to a bit line selection signal.

The word lines WL and the bit lines BL intersect with each other. The memory transistors MT1, MT2, MT3 and MT4 are disposed at the intersections. A gate of each of the memory transistors MT1, MT2, MT3 and MT4 is made of a corresponding word line WL. A source of each of the memory transistors MT1, MT2, MT3 and MT4 is connected to a ground line VL through a first contact hole FC1.

A drain d of each of the memory transistors MT1, MT2, MT3 and MT4 is connected to a corresponding bit line BL respectively, through a first contact hole FC2 (not shown), a second contact hole SC (not shown) and a third contact hole TC.

The bit lines BL are made of an uppermost metal layer, i.e., a third metal layer. A couple of bit lines BL are disposed to cover the memory transistors MT1, MT2, MT3 and MT4.

Figure 3:
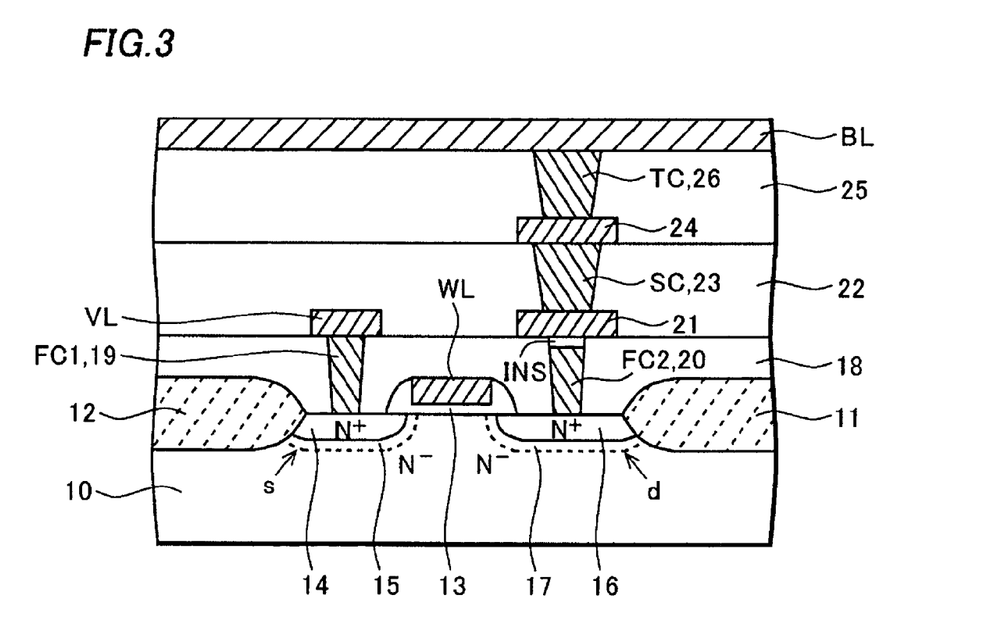
FIG. 3 is a cross-sectional view showing a section X—X in the ROM shown in FIG. 2.

Next, the ROM according to the first embodiment will be explained in detail, referring to its cross-sectional view. FIG. 3 is a cross-sectional view showing a section X—X of the ROM shown in FIG. 2. That is, FIG. 3 is a cross-sectional view showing a structure of the memory transistor MT1. The memory transistors MT2, MT3 and MT4 and other memory transistors not shown in the figure have the same structure as the structure shown in FIG. 3.

Field oxide films 11 and 12 to isolate the transistors are formed on a semiconductor substrate 10 made of P-type silicon, or the like. And a gate insulation film 13 is formed on the semiconductor substrate 10 between the field oxide films 11 and 12. The word line WL, which serves as the gate, is formed on the gate insulation film 13. And the source s composed of an $N^+$-type layer 14 and an $N^-$-type layer 15 is formed in a surface of the semiconductor substrate 10 adjacent one side of the word line WL. Also, the drain d composed of an $N^+$-type layer 16 and an $N^-$-type layer 17 is formed in the surface of the semiconductor substrate 10 adjacent the other side of the word line WL. In other words, the memory transistor MT1 has an LDD (Lightly Doped Drain) structure. The other memory transistors also have the same LDD structure.

And a first interlayer insulation layer 18 is formed on the memory transistor MT1. A couple of first contact holes FC1 and FC2 are formed in the first interlayer insulating layer 18. The first contact hole FC1 is formed to expose the source s of the memory transistor MT1. A W plug 19 is buried in the first contact hole FC1. The W plug means tungsten (W) buried in a contact hole. The ground line VL is formed on the W plug 19, and is electrically connected with the source s of the memory transistor MT1 through the W plug 19.

The other first contact hole FC2 is formed to expose the drain d of the memory transistor MT1. A W plug 20 is buried in the first contact hole FC2. In addition, an insulation layer INS made of a predetermined thickness of a silicon oxide film, or the like, is formed on top of the W plug 20 in the first contact hole FC2 by plasma CVD (Chemical Vapor Deposition), or the like. The insulation layer INS is designed to be subject to dielectric breakdown by applying a predetermined voltage to it.

A first metal layer 21 is formed on the insulation layer INS on the top of the W plug 20. The first metal layer 21 is electrically connected with the drain d of the memory transistor MT1 through the W plug 20, when the insulation layer INS is destroyed by the dielectric breakdown. The first metal layer 21 has a predetermined amount of extension around the first contact hole FC2.

And a second interlayer insulation layer 22 is formed on the ground line VL and the first metal layer 21. The second contact hole SC is formed in the second interlayer insulation layer 22. The second contact hole SC is formed to expose a surface of the first metal layer 21, and filled with a W plug 23.

Furthermore, a second metal layer 24 is formed on the W plug 23. The second metal layer 24 is electrically connected with the underlying first metal layer 21 through the W plug 23. The second metal layer 24 has a predetermined amount of extension around the second contact hole SC. And a third interlayer insulation layer 25 is formed on the second metal layer 24.

The third contact hole TC is formed in the third interlayer insulation layer 25 to expose a surface of the second metal layer 24. A W plug 26 is buried in the third contact hole TC. Furthermore, the bit line BL made of the third metal layer is formed on the W plug 26. Therefore, the drain d of the memory transistor MT1 is electrically connected to the bit line BL through the W plug 20, the W plug 23 and the W plug 26, when the insulation layer INS is destroyed by the dielectric breakdown. Note that the memory transistors MT2, MT3 and MT4 and other memory transistors have the same structure as the structure of the memory transistor MT1, although their cross-sectional views are not shown.

Programming operation to write digital data "1" or "0" into the ROM describe above will be explained next. The operation to write digital data "1" into the memory transistor will be explained first. For example, suppose the digital data "1" is written into the memory transistor MT1. In this case, the word line WL connected to the memory transistor MT1 is selected by the word line selection circuit WS and the electric potential of the word line WL is turned to a high level. Also, the bit line BL connected to the memory transistor MT1 is selected by the bit line selection circuit BS. As a result, the memory transistor MT1 is turned on, and a predetermined programming voltage is applied to the bit line connected to the memory transistor MT1. The predetermined voltage is a high enough voltage to cause the dielectric breakdown to the insulation layer INS formed in the first contact hole FC2 of the memory transistor MT1 to which the bit line BL is connected.

Since the memory transistor MT1 is turned on at that time by the high electric potential on the word line WL, the drain d of the memory transistor MT1 is pulled to the ground potential. Thus the programming voltage applied to the bit line BL is fully applied across a capacitance between the bit line BL and the drain d, that is, the insulation layer INS. This causes the dielectric breakdown of the insulation layer INS and the drain d of the memory transistor MT1 is electrically connected to the corresponding bit line BL. The memory transistor, the drain d of which is connected to the bit line BL by the dielectric breakdown, is referred to as a memory transistor in a memory status "1".

Although the memory transistor MT3 and other memory transistors not shown in the figure are connected to the same bit line BL, to which the memory transistor MT1 is connected, the digital data "1" is not written into the memory transistor MT3 and the other memory transistors.

The word lines WL connected to the memory transistor MT3 and the other memory transistors are at a low level. Therefore, these memory transistors are in OFF state.

In each of the memory transistors in OFF state, there are junction capacitances (capacitances of depletion layers in PN junctions) at borders between the P-type semiconductor substrate 10 at the ground potential and active layers of the N⁻-type layers 15 and 17 (or N⁺-type layers 14 and 16). Thus the program voltage applied to the bit line BL is divided into a voltage across the capacitance of the insulation layer INS and a voltage across the junction capacitance. The divided program voltage does not cause the dielectric breakdown of the insulation layer INS. As a result, the dielectric breakdown of the insulation layer INS does not occur when the predetermined voltage of the program voltage is applied to the bit line BL connected to the memory transistors in OFF state.

The operation to write the digital data "0" into the memory transistor will be explained next. No particular programming operation is required to write the digital data "0", according to the embodiment. For example, when a memory status of the memory transistor MT2 is desired to be the digital data "0", it is done by simply not providing the corresponding bit line with the predetermined programming voltage, which is high enough to cause the dielectric breakdown of the insulation layer INS.

In this case, the dielectric breakdown of the insulation layer INS formed in the first contact hole FC2 of the memory transistor MT2 does not occur. In other words, the drain d of the memory transistor MT2 remains insulated from the corresponding bit line BL with the insulation layer INS formed in the first contact hole FC2. The memory transistor, the drain of which is insulated from the corresponding bit line BL with the insulation layer INS not destroyed by the dielectric breakdown, is referred to as a memory transistor in the memory status "0".

Next, the operation to read the digital data "1" or "0" from the ROM described above will be explained. It is assumed that the digital data is read out from the memory transistor MT1 which is in the memory status "1", or the like. In this case, the word line WL connected to the memory transistor MT1 is selected by the word line selection circuit WS and the electric potential of the word line WL is turned to the high level. Also, the bit line BL connected to the memory transistor MT1 is selected by the bit line selection circuit BS. Note that the bit line BL is initially set at a predetermined voltage of a pre-charge voltage (for example, the power supply voltage Vdd).

As a result, the memory transistor MT1 is turned to an ON status. Because the insulation layer INS formed in the first contact hole FC2 of the memory transistor MT1 has been already destroyed by the dielectric breakdown, the drain d of the memory transistor MT1 and the corresponding bit line BL are electrically connected with each other. Thus, the ground potential Vss of the ground line VL is outputted to the bit line BL through the memory transistor MT1. As a result, the electric potential on the bit line BL is turned from the pre-charge voltage to the ground potential Vss. The ground potential on the bit line BL is outputted as the digital data "1" from the bit line BL to the outside of the ROM through an output buffer BF.

Now, suppose that the memory transistor MT2 which is in the memory status "0" is selected by the word line selection circuit WS and the bit line selection circuit BS. In this case, the word line WL connected to the memory transistor MT2 is turned to the high level while the bit line BL connected to the memory transistor MT2 is selected.

As a result, the memory transistor MT2 is turned to the ON status. In this case, however, the drain d of the memory transistor MT2 and the corresponding bit line BL are not electrically connected with each other because the insulation layer INS formed in the first contact hole FC2 of the memory transistor MT2 has not been destroyed by the dielectric breakdown.

As a result, the electric potential of the bit line BL remains at the pre-charge voltage. The pre-charge voltage on the bit line BL is outputted as the digital data "0" from the bit line BL to the outside of the ROM through the output buffer BF.

As described above, programming the digital data "1" or "0" into the ROM, as well as reading out the data from the ROM, is made possible based on whether the insulation layer INS formed in the first contact hole FC2 of each memory transistor is destroyed by the dielectric breakdown by applying the predetermined programming voltage (high voltage) from the corresponding bit line BL.

Also, the user can program his digital data after the ROM or a product incorporating the ROM is completed and shipped. That is, desired digital data varied by each user can be programmed in the ROM at the user's discretion.

Although the insulation layer INS is formed between the W plug 20 in the first contact hole FC2 and the first metal layer 21 in the embodiment described above, the insulation layer INS may be formed in locations other than the location between the W plug 20 in the first contact hole FC2 and the first metal layer 21, as long as it is formed between each memory transistor and the corresponding bit line BL. This modification may be implemented as shown in the second and third embodiments described hereafter.

Figure 4:
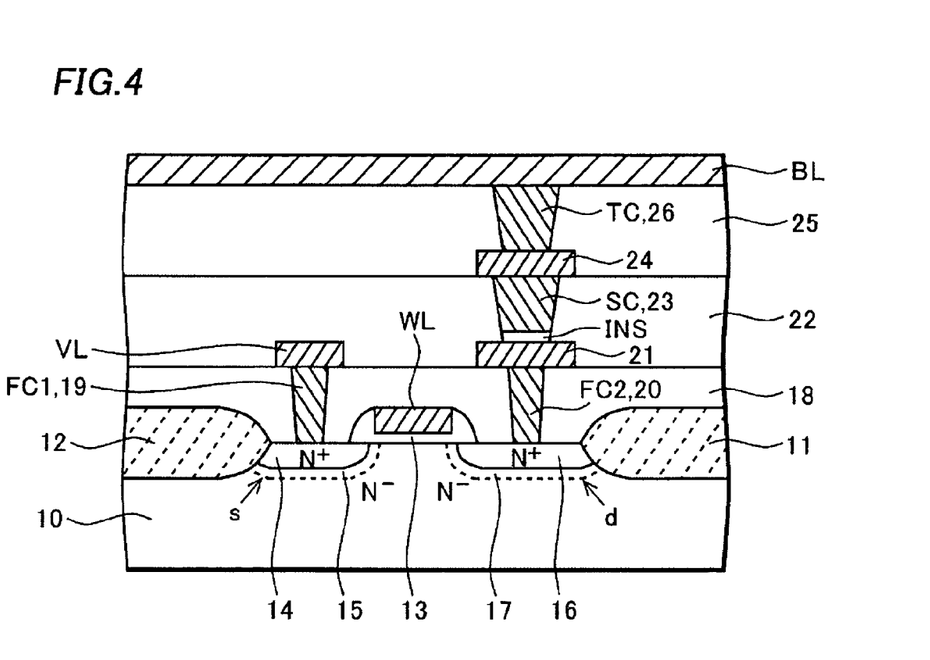
FIG. 4 is a cross-sectional view of a ROM according to a second embodiment of this invention.

The second embodiment of this invention will be explained next, referring to FIG. 4. FIG. 4 is a cross-sectional view of a ROM according to the second embodiment of this invention. The same reference numerals are used in FIG. 4 as in FIG. 3 for the common components, and detailed explanations on them are omitted. The insulation layer INS (made of a silicon oxide film, or the like) may be formed between the first metal layer 21 and the W plug 23 in the second contact hole SC, as shown in FIG. 4. Or the insulation layer INS may be formed between the N⁺-type layer 16 (that is, the drain d) and the W plug 20 in the first contact hole FC2, between the second metal layer 24 and the W plug 26 in the third contact hole TC, or between the W plug 26 in the third contact hole TC and the bit line BL, although they are not shown in the figure. The programming operation and the read out operation of the digital data in the second embodiment are similar to the operations described in the first embodiment.

Figure 5:
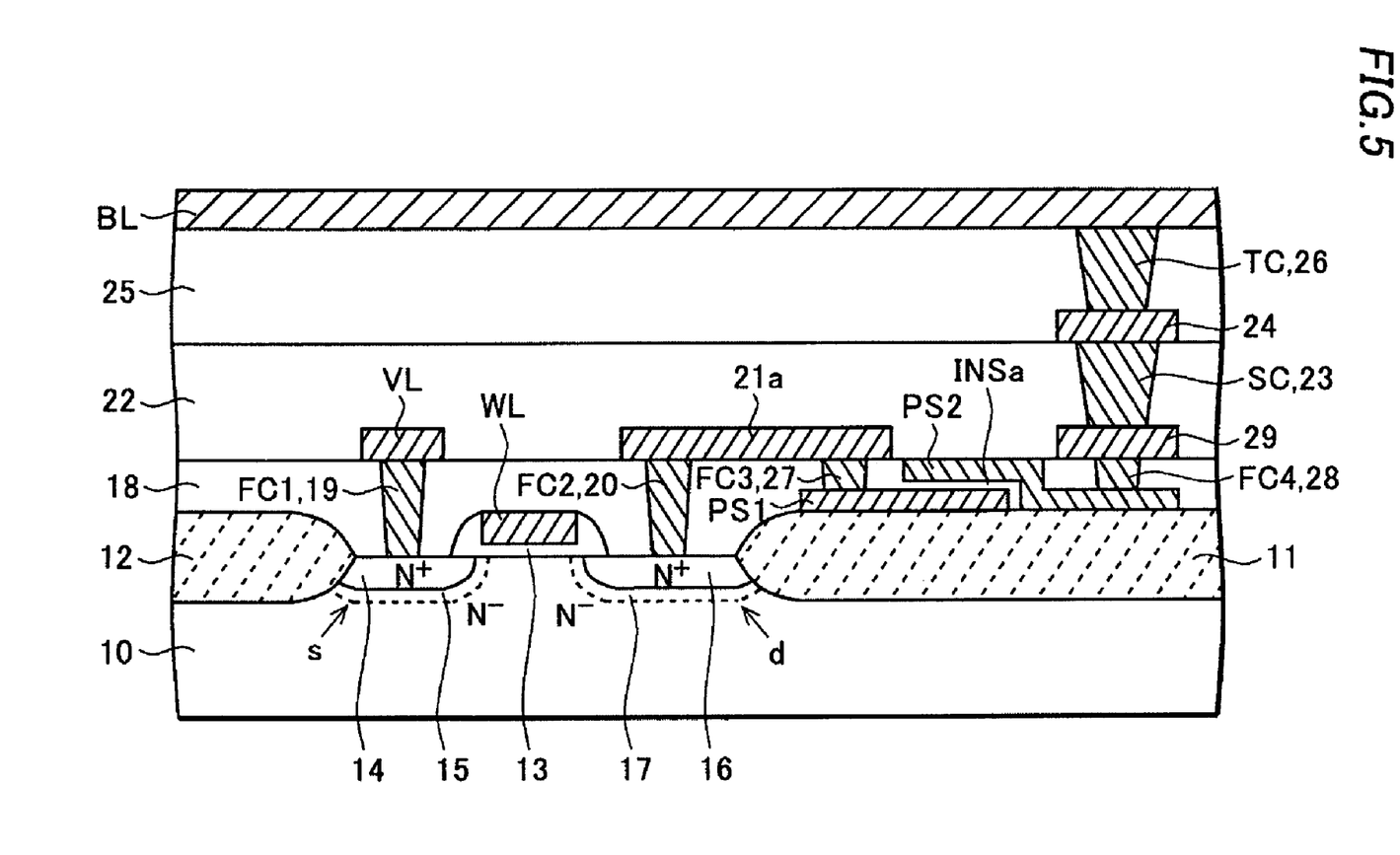
FIG. 5 is a cross-sectional view of a ROM according to a third embodiment of this invention.

The third embodiment of this invention will be explained next, referring to FIG. 5. The same reference numerals are used in FIG. 5 as in FIG. 3 and FIG. 4 for the common components, and detailed explanations on them are omitted. FIG. 5 is a cross-sectional view of a ROM according to the third embodiment of this invention. As shown in FIG. 5, the W plug 20 is buried in the first contact hole FC2 which is opened to expose the drain d of the memory transistor, as in the first and the second embodiments. And the W plug 20 is connected to a first metal layer 21*a* having a predetermined amount of extension around the first contact hole FC2. Unlike the first and the second embodiments, the second contact hole SC, the third contact hole TC, W plugs 23 and 26 and the second metal layer 24 are not formed above the first metal layer 21*a*.

A first polysilicon layer PS1 is formed on the field oxide film 11 adjacent the drain d of the memory transistor in this embodiment. And a first contact hole FC3 is opened to expose the first polysilicon layer PS1. A W plug 27 is buried in the first contact hole FC3. The W plug 27 connects the first polysilicon layer PS1 with the first metal layer 21*a* electrically.

And an insulation layer INSa made of a silicon oxide film, or the like, and having a predetermined thickness is formed on the first polysilicon layer PS1. The insulation layer INSa can be destroyed in a similar manner to the insulation layer INS in the first and the second embodiments by applying the predetermined programming voltage.

And a second polysilicon layer PS2 is formed over the field oxide film 11, separated from the first polysilicon layer PS1. A part of the second polysilicon layer PS2 is formed to cover a part of the first polysilicon layer PS1 through the insulation layer INSa. That is, the first polysilicon layer PS1 and the second polysilicon layer PS2 are insulated from each other with the insulation layer INSa.

The first interlayer insulation layer 18 and the second interlayer insulation layer 22 are formed over the second polysilicon layer PS2. A first contact hole FC4 is formed in the first interlayer insulation layer 18 to expose the second polysilicon layer PS2. A W plug 28 is buried in the first contact hole FC4. A first metal layer 29 is formed on the W plug 28. The first metal layer 29 is insulated by the second interlayer insulation layer 22 from the first metal layer 21*a* connected to the drain d of the memory transistor.

The structure above the first metal layer 29 is the same as the structure of the first embodiment. That is, the second interlayer insulation layer 22 is formed on the first metal layer 29. The second contact hole SC is formed in the second interlayer insulation layer 22 to expose the first metal layer 21. The W plug 23 is buried in the second contact hole SC. The second metal layer 24 is formed on the W plug 23. A third interlayer insulation layer 25 is formed on the second metal layer 24. The third contact hole TC is formed in the third interlayer insulation layer 25 to expose the second metal layer 24. The W plug 26 is buried in the third contact hole TC. And the W plug 26 is electrically connected with the bit line BL made of the uppermost metal layer.

The programming operation in this embodiment is performed by inducing the dielectric breakdown of the insulation layer INSa formed between the first polysilicon layer PS1 and the second polysilicon layer PS2 by applying the predetermined programming voltage, which can be applied from the bit line BL. That is, when the insulation layer INSa is destroyed by the dielectric breakdown, the memory status of the memory transistor is assumed to be "1". On the other hand, when the insulation layer INSa is not destroyed by the dielectric breakdown, the memory status of the memory transistor is assumed to be "0". And the read out operation of the digital data is the same as in the first and the second embodiments.

Since the insulation layer INSa in the third embodiment is formed on the first polysilicon layer PS1, it can be made thinner than the insulation layer INS formed in the contact hole in the first and the second embodiments. For example, while the insulation layer INS in the first and the second embodiments is about 20 nm thick because it is formed by plasma CVD, the insulation layer INSa in the third embodiment may be formed as thin as about 5 nm by LPCVD (Low Pressure CVD). As a result, the dielectric breakdown of the insulation layer INSa can be caused by applying a lower programming voltage than in the first and the second embodiments (the insulation layer INS being thick). That is, the ROM of the third embodiment can be more suitable memory as the memory used in the non-contact fashion electronic tag capable of operating with lower power supply voltage, or the like.

All ROMs described in the embodiments have three metal layers, that is, the first metal layer 21, the second metal layer 24 and the bit line BL. However, this invention is not limited to that, and may be applied to a ROM having two metal layers or more than three metal layers.

Also, the insulation layers INS and INSa are made of silicon oxide in all the embodiments described above. However this invention is not limited to that, and the insulation layer may be made of a silicon nitride film or stacked layers of a silicon oxide film and a silicon nitride film, or the like. In other words, the insulation layer may be made of a thin film other than the silicon oxide film, as long as it can be formed in the memory transistor to have a predetermined thickness and can be destroyed by the dielectric breakdown by applying a predetermined programming voltage.

Also, the source s of each memory transistor is connected to the ground line VL in all the embodiments. However, this invention is not limited to that. That is, the source of each memory transistor may be connected to a power supply line which is provided with the power supply voltage Vdd. In this case, the pre-charge electric potential is set to the ground potential Vss, for example. And when the memory status of the selected memory transistor is "0", the ground potential Vss is outputted from the drain as the pre-charge electric potential. On the other hand, the power supply voltage Vdd is outputted form the drain when the memory status of the selected memory transistor is "1".

The insulation layer which can be destroyed by the dielectric breakdown by the predetermined voltage applied from the bit line is formed in the contact hole connecting the memory transistor with the bit line. It is made possible for the user to program the desired digital data in the ROM, after the ROM or the product incorporating the ROM is shipped.

Also, the ROM having the programming function according to the embodiments can be manufactured by simpler manufacturing process than the EPROM or the EEPROM having the same function. Furthermore, the ROM according to this invention has higher environmental immunity than the EPROM or the EEPROM.

As described above, by incorporating the ROM having the programming function, it is made possible to offer a product such as an electronic tag having higher environmental immunity at a lower price than a product incorporating the EPROM or the EEPROM.

What is claimed is:

1. A programmable nonvolatile semiconductor memory device comprising:
    a memory transistor;
    a word line connected to a gate of the memory transistor;
    a first insulation layer disposed on the memory transistor;
    a first metal plug formed in the first insulation layer and on a drain of the memory transistor;
    a first metal layer formed on the first metal plug;
    a second insulation layer formed on the first insulation layer and the first metal layer;
    a second metal plug formed in the second insulation layer and on the first metal layer;

a second metal layer formed on the second metal plug; and an insulation film disposed either between the drain of the memory transistor and the first metal plug, between the first metal plug and the first metal layer, between the first metal layer and the second metal plug or between the second metal plug and the second metal layer, wherein a conductive path is provided between the drain of the memory transistor and the second metal layer except the insulation film, and the insulation film is thin enough for dielectric breakdown under application of a predetermined voltage so that a data bit is written in the memory transistor.

2. The programmable nonvolatile semiconductor memory device of claim 1, wherein the second metal layer comprises a bit line.

3. A programmable nonvolatile semiconductor memory device comprising:

a memory transistor;

a word line connected to a gate of the memory transistor;

a first polysilicon layer electrically connected to a drain of the memory transistor;

a second polysilicon layer provided to cover part of the first polysilicon layer;

an insulation film insulating the first polysilicon layer from the second polysilicon layer; and a bit line electrically connected to the second polysilicon layer, wherein the insulation film is thin enough for dielectric breakdown under application of a predetermined voltage so that a data bit is written in the memory transistor.

4. The programmable nonvolatile semiconductor memory device of claim 3, wherein the first polysilicon layer is disposed on a field oxide film.

5. A programmable nonvolatile semiconductor memory device comprising:

a memory transistor;

a word line connected to a gate of the memory transistor;

a first polysilicon layer electrically connected to a drain of the memory transistor;

a second polysilicon layer provided to cover part of the first polysilicon layer;

an insulation film insulating the first polysilicon layer from the second polysilicon layer;

an insulation layer disposed on the second polysilicon layer, a metal plug formed in the insulation layer and electrically connected to the second polysilicon layer; and a metal layer disposed on the metal plug, wherein the insulation film is thin enough for dielectric breakdown under application of a predetermined voltage so that a data bit is written in the memory transistor.

6. The programmable nonvolatile semiconductor memory device of claim 5, wherein the metal layer comprises a bit line.

7. The programmable nonvolatile semiconductor memory device of claim 1, 3 or 5, wherein the word line is configured to be set at a predetermined electric potential when the memory transistor is turned on.

8. The programmable nonvolatile semiconductor memory device of claim 1, 3 or 5, wherein the insulation film comprises a silicon oxide film, a silicon nitride film or stacked layers of a silicon oxide film and a silicon nitride film.

* * * * *